United States Patent
Akasaka et al.

(10) Patent No.: US 10,423,219 B2
(45) Date of Patent: Sep. 24, 2019

(54) ELECTRICAL APPARATUS (71) Applicant: MAX CO., LTD., Chuo-ku, Tokyo (JP)

(72) Inventors: Haruaki Akasaka, Tokyo (JP); Shinichi Ohkubo, Tokyo (JP)

(73) Assignee: MAX CO., LTD., Tokyo (JP)

( * ) Notice: Subject to any disclaimer, the term of this patent is extended or adjusted under 35 U.S.C. 154(b) by 0 days.

(21) Appl. No.: 16/220,176

(22) Filed: Dec. 14, 2018

(65) Prior Publication Data
US 2019/0187777 A1 Jun. 20, 2019

(30) Foreign Application Priority Data
Dec. 15, 2017 (JP) .................... 2017-241063

(51) Int. Cl.
| | | |
|---|---|---|
| G11C 5/14 | (2006.01) | |
| H02H 7/00 | (2006.01) | |
| G06F 1/3296 | (2019.01) | |
| H02H 7/085 | (2006.01) | |
| H02H 7/09 | (2006.01) | |
| H02H 7/08 | (2006.01) | |
| G01R 19/00 | (2006.01) | |

(52) U.S. Cl.
CPC ......... *G06F 1/3296* (2013.01); *H02H 7/0833* (2013.01); *H02H 7/0854* (2013.01); *H02H 7/09* (2013.01); *G01R 19/0084* (2013.01); *G01R 19/0092* (2013.01)

(58) Field of Classification Search
CPC ......... G11C 5/147; G05F 1/465; G05F 3/205; G05F 3/262; H04B 1/1623; H02H 7/08; H02H 7/085; H02H 7/09; H02H 7/0852; F25B 49/005

USPC ............................................. 327/530; 361/22
See application file for complete search history.

(56) References Cited

U.S. PATENT DOCUMENTS

| | | | |
|---|---|---|---|
| 6,176,683 B1 | 1/2001 | Yang | |
| 7,408,310 B2 * | 8/2008 | Hong | ................ F04B 35/045 |
| | | | 318/119 |

(Continued)

FOREIGN PATENT DOCUMENTS

| | | |
|---|---|---|
| EP | 1 609 660 A1 | 12/2005 |
| EP | 3 128 172 A1 | 2/2017 |
| JP | 2006-288053 A | 10/2006 |

OTHER PUBLICATIONS

European Search Report issued in Application No. 18212841.3, dated Feb. 28, 2019 (6 pages).

*Primary Examiner* — Anh Q Tra
(74) *Attorney, Agent, or Firm* — Rothwell, Figg, Ernst & Manbeck, P.C.

(57) ABSTRACT

An electrical apparatus is connected to a power supply and changes operation in accordance with variation of a power supply voltage of the power supply in accordance with drive of another electrical apparatus connected to the same power supply. The electrical apparatus includes a drive unit driven by the power supply, a voltage detection unit, a current detection unit, and a control unit which sets a threshold value with which a circuit breaker which breaks the power supply is not driven, based on (i) a power supply voltage of the power supply detected by the voltage detection unit when the drive unit is driven, (ii) a power supply voltage of the power supply detected by the voltage detection unit when the drive unit is not driven, and (iii) a current detected by the current detection unit when the drive unit is driven.

8 Claims, 6 Drawing Sheets (56) References Cited

U.S. PATENT DOCUMENTS

2004/0191073 A1 9/2004 Iimura et al.
2018/0202430 A1* 7/2018 Jung .................... F04B 35/045

* cited by examiner

ELECTRICAL APPARATUS

CROSS-REFERENCE TO RELATED APPLICATIONS

This application is based on and claims priority under 35 USC 119 from Japanese Patent Application No. 2017-241063 filed on Dec. 15, 2017, the contents of which are incorporated herein by reference.

TECHNICAL FIELD

The present invention relates to an electrical apparatus driven by supplying electricity from a power supply.

BACKGROUND ART

At a construction site, a plurality of electrical apparatuses connected to a power supply such as a commercial power supply and a generator are used. An electrical apparatus used at such a construction site is an air compressor. The air compressor is widely used at a work site as a means that supplies compressed air to a tool actuated by compressed air such as a nailing machine.

When a plurality of electrical apparatuses are used at the same time, the power consumption increases and an overcurrent flows, so that a circuit breaker of the power supply may be actuated. When the circuit breaker is actuated, work is interrupted, handling of returning the circuit breaker is required, and work efficiency is reduced.

In a case of the air compressor, an operator often holds the nailing machine or the like and works in a place away from the air compressor, and may not immediately notice that the circuit breaker is actuated and the air compressor stops. In such a case, the stored compressed air may be insufficient, a driving failure or the like may occur, and the work efficiency is further reduced.

Therefore, there has been proposed an electrical apparatus capable of detecting a voltage supplied from a power supply and suppressing power consumption when a detection voltage is lowered with respect to a predetermined reference voltage (see, for example, JP-A-2006-288053).

SUMMARY OF THE INVENTION

At a construction site, an electrical apparatus such as an air compressor is often connected to a power supply using an extension cord such as a cord reel. Use of the extension cord causes a voltage drop and a voltage drop amount varies with the length of the extension cord. Therefore, in a method of switching operation by comparing the detection voltage with the predetermined reference voltage, the voltage drop due to use of the extension cord may be detected in error as a voltage drop due to use of a plurality of electrical apparatuses.

The present invention has been made to solve such a problem, and an object of the present invention is to provide an electrical apparatus capable of excluding other factors and focusing on voltage variation due to drive of the electrical apparatus, and setting a threshold value for determining whether a circuit breaker may be actuated based on a power supply voltage.

MEANS FOR SOLVING THE PROBLEMS

In order to solve the above-described problems, an electrical apparatus is used by being connected to a power supply and changes operation in accordance with variation of a power supply voltage of the power supply in accordance with drive of another electrical apparatus connected to the same power supply. The electrical apparatus includes a drive unit, a voltage detection unit, a current detection unit and a control unit. The drive unit is configured to be driven by electricity supplied from the power supply. The voltage detection unit is configured to detect a power supply voltage of the power supply. The current detection unit is configured to detect a current flowing by driving the drive unit. The control unit is configured to set a threshold value with which a circuit breaker which breaks the power supply is not driven, based on (i) a power supply voltage detected by the voltage detection unit when the drive unit is driven, (ii) a power supply voltage detected by the voltage detection unit when the drive unit is not driven, and (iii) a current detected by the current detection unit when the drive unit is driven.

In the present invention, when the power supply voltage changes since the air compressor and other electrical apparatuses are driven, the drive unit is controlled such that the variation amount of the power supply voltage does not exceed the threshold value by comparing the variation amount of the power supply voltage with the threshold value.

EFFECT OF THE INVENTION

In the present invention, the threshold value can be set based on a measured value by acquiring the threshold value at which the circuit breaker is not actuated, according to the current flowing by driving the drive unit. This makes it possible to eliminate voltage variation caused by external factors such as resistance of the power supply itself and resistance of wiring between the power supply and the electrical apparatus, and to determine whether an overcurrent through which the circuit breaker can be actuated flows based on the power supply.

Therefore, it is possible to determine whether the overcurrent through which the circuit breaker can be actuated flows based on the power supply voltage, and the operation is possible without suppressing the actuation of the circuit breaker and without reducing output of the electrical apparatus more than necessary.

DESCRIPTION OF EMBODIMENTS

Hereinafter, an embodiment of an air compressor will be described as an example of the electrical apparatus of the present invention with reference to the drawings.

Configuration Example of Air Compressor of the Present Embodiment

Figure 1:
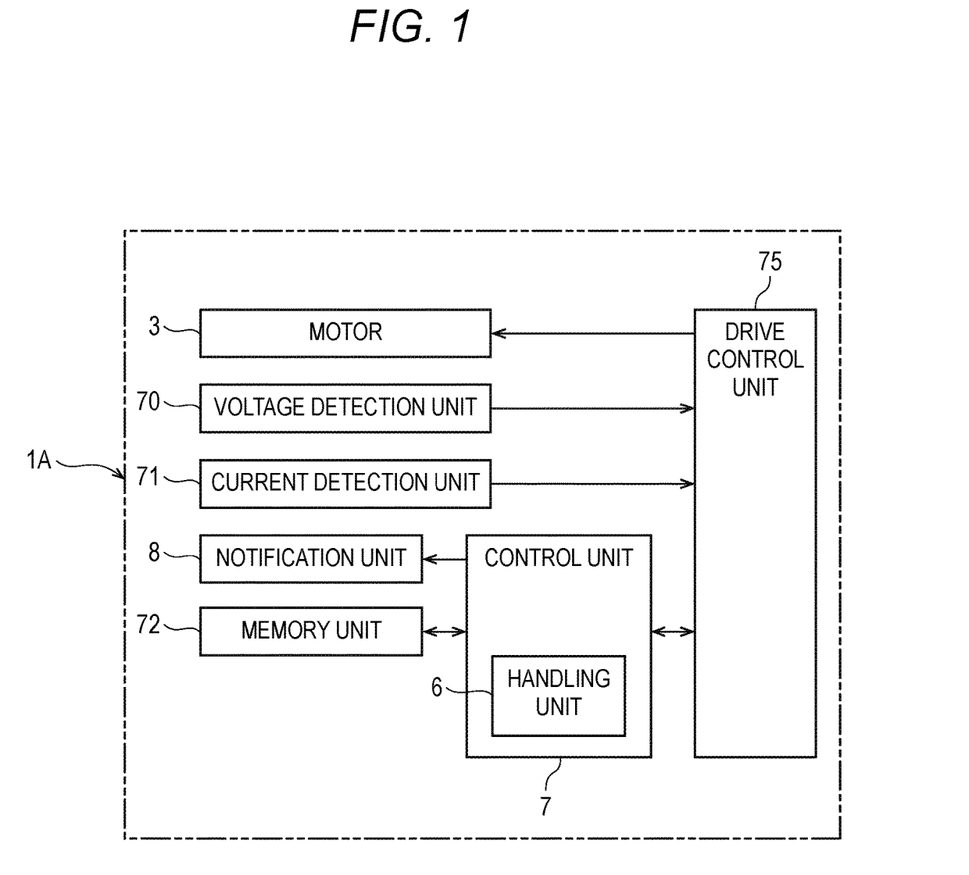
FIG. 1 is a functional block diagram illustrating an example of a control system of an air compressor of the present embodiment.
Figure 2:
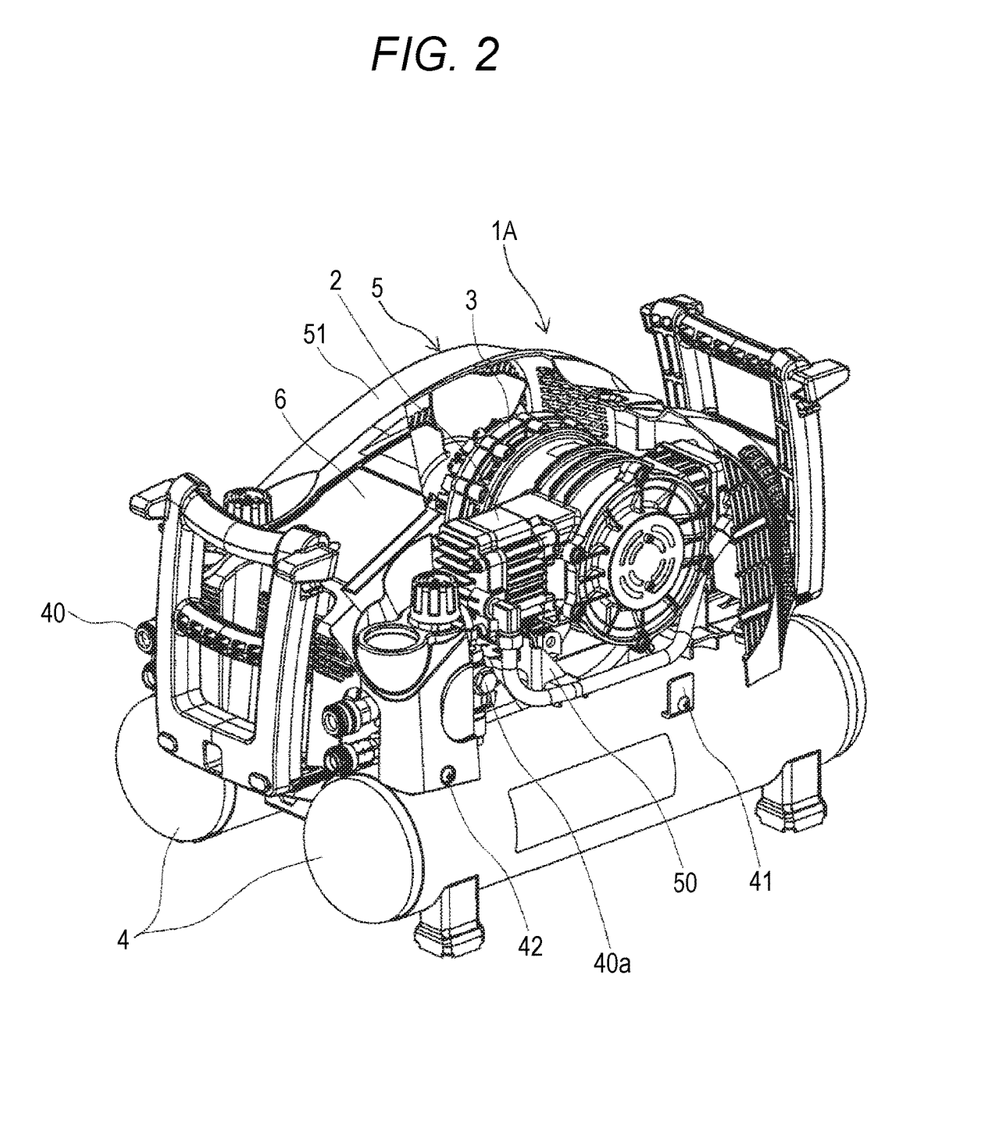
FIG. 2 is a partially broken perspective view illustrating an example of the air compressor of the present embodiment.

FIG. 1 is a functional block diagram illustrating an example of a control system of an air compressor of the present embodiment, and FIG. 2 is a partially broken perspective view illustrating an example of the air compressor of the present embodiment.

As illustrated in FIG. 2, the air compressor 1A of the present embodiment includes a compression unit 2 that compresses air as an example of gas, a motor 3 that drives the compression unit 2, and at least one tank 4 that stores air compressed by the compression unit 2. The air compressor 1A includes a compression unit 2, a motor 3, and a tank 4 to constitute a body unit 5.

The compression unit 2 is an example of a compression unit, and is a configuration called a reciprocating compressor that compresses air by changing a cylinder volume by a reciprocating motion of a. piston that is not illustrated in this example. The compressor 2 connects an intake port (not illustrated) and the tank 4, inhales air from the intake port, and pumps the inhaled air to the tank 4 to store the compressed air in the tank 4.

The motor 3 is an example of a drive unit and is driven by receiving electrical supply. The compression unit 2 controls the pressure in the tank 4 by driving and stopping the motor 3 and controlling rotation speed.

The tank 4 is an example of a storage unit, and an air outtake port 40 is connected via a pressure reducing valve 40a. A hose connected to a tool that is actuated by the compressed air is attachable and detachably connected to the air outtake port 40. In the air compressor 1A, when the hose is not connected to the air outtake port 40, a valve (not illustrated) is closed. In contrast, a hose is connected to the air outtake port 40, so that a valve (not illustrated) opens, and the compressed air stored in the tank 4 is supplied to the tool.

In the body unit 5 of the air compressor 1A, two tanks 4 are attached to a support 50 made of metal or the like, and the compression unit 2 and the motor 3 are attached to an upper side of the tank 4 via the support 50.

The air compressor 1A includes a cover 51 that covers the upper portion of the body unit 5 in a shape covering the compressor 2 and the motor 3. The cover 51 is made of resin, for example, and is attached to a receiving unit 41 provided on the tank 4 by screws 42.

The air compressor 1A includes a handling unit 6 that outputs various information such as various handling such as selection of ON and OFF of a power supply and an action mode, and display of pressure values in the tank 4. The handling unit 6 is an example of an operation unit and is provided on an upper surface of a cover 51.

Figure 3:
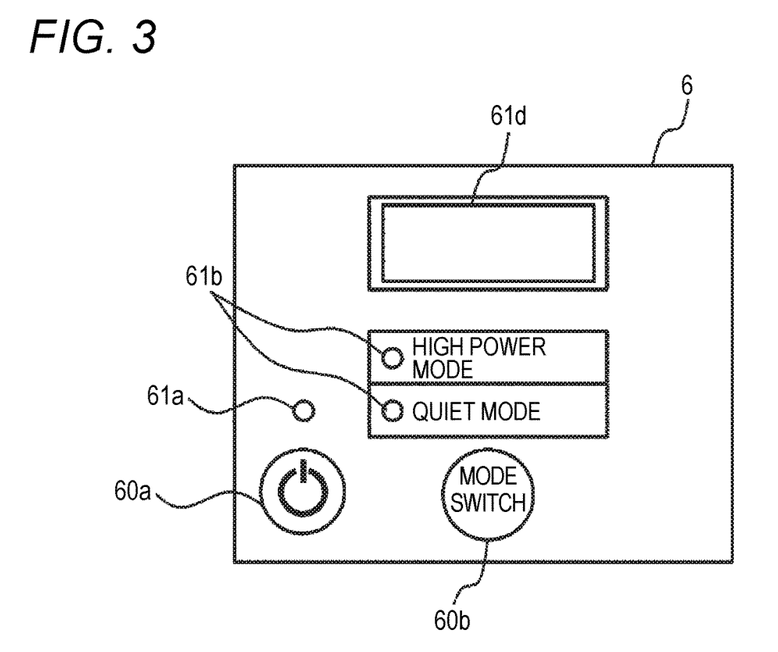
FIG. 3 is an explanatory diagram illustrating an example of a handling unit.

FIG. 3 is an explanatory diagram illustrating an example of a handling unit. The handling unit 6 includes a power button 60a that selects ON and OFF of the power supply, and an operation mode selection button 60b that selects an operation mode as the action mode.

The handling unit 6 includes a power lamp 61a indicating a state of ON and OFF of a power supply, an operation mode selection lamp 61b indicating a selected operation mode, and a display unit 61d displaying a pressure value or the like in the tank 4.

Figure 4:
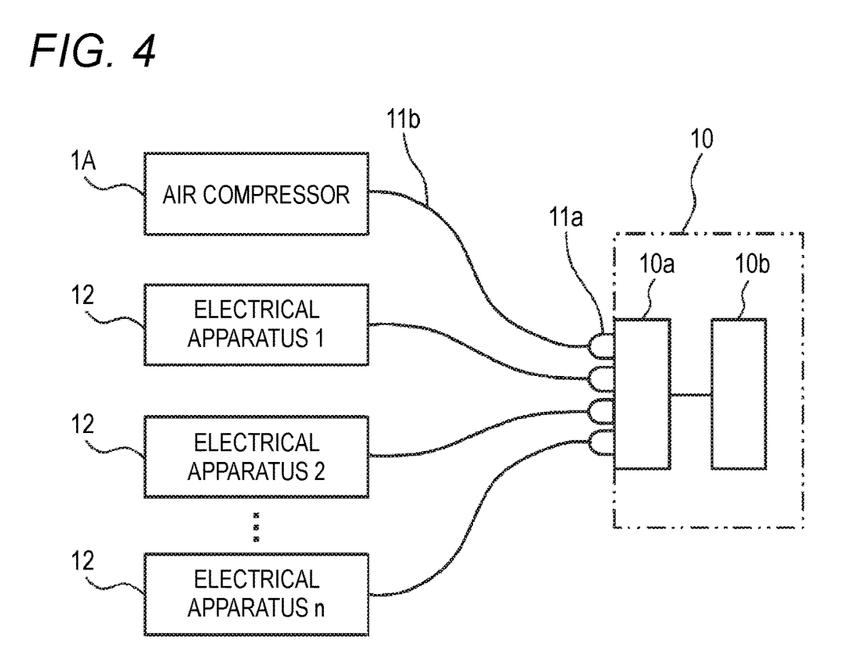
FIG. 4 is a block diagram illustrating an example of a use configuration of the air compressor of the present embodiment.

FIG. 4 is a block diagram illustrating an example of a use configuration of the air compressor of the present embodiment, and then a use configuration of the air compressor 1A of the present embodiment will he described. As illustrated in FIG. 4, the air compressor 1A is connected to an outlet 10a of a power supply 10 such as a commercial power supply or a generator via a power plug 11a and a cord 11b, and is supplied with electricity. Other electrical apparatuses 12 are connected to the power supply 10 via the power plug 11a and the cord 11b. The power supply 10 is provided with a circuit breaker 10b, and supply of electricity is broken by the circuit breaker 10b when an overcurrent exceeding a preset allowable current.

Next, a control function of the air compressor 1A of the present embodiment will be described. The air compressor 1A includes a control unit 7 that performs an operation of suppressing power consumption of the air compressor 1A in accordance with variation of a voltage of the power supply 10 to which the air compressor 1A is connected, and a drive control unit 75 that drives the motor 3 in accordance with the operation of suppressing power consumption. The control unit 7 is an example of a control unit and includes a microprocessor and the like. A drive control unit 75 is an example of a drive control unit and includes a microprocessor and a memory.

The air compressor 1A includes a voltage detection unit 70 and a current detection unit 71. The voltage detection unit 70 is an example of a voltage detection unit and detects a voltage of the power supply 10. The voltage detection unit 70 can monitor a waveform of the voltage supplied from the power supply 10 and notify presence or absence of an abnormality. The current detection unit 71 is an example of a current detection unit, and detects a current flowing by driving the motor 3 with the drive control unit 75.

The air compressor 1A includes a memory unit 72 that memorizes a value of the voltage of the power supply 10 detected by the voltage detection unit 70, a value of the current detected by the current detection unit 71, and the like. The memory unit 72 is an example of a memory unit and includes a semiconductor memory such as a ROM and a RAM.

The air compressor 1A includes a notification unit 8 that outputs sound. The notification unit 8 is an example of a notification unit and includes, for example, a buzzer that outputs a beep sound.

Motion Example of Air Compressor of the Present Embodiment

Figure 5:
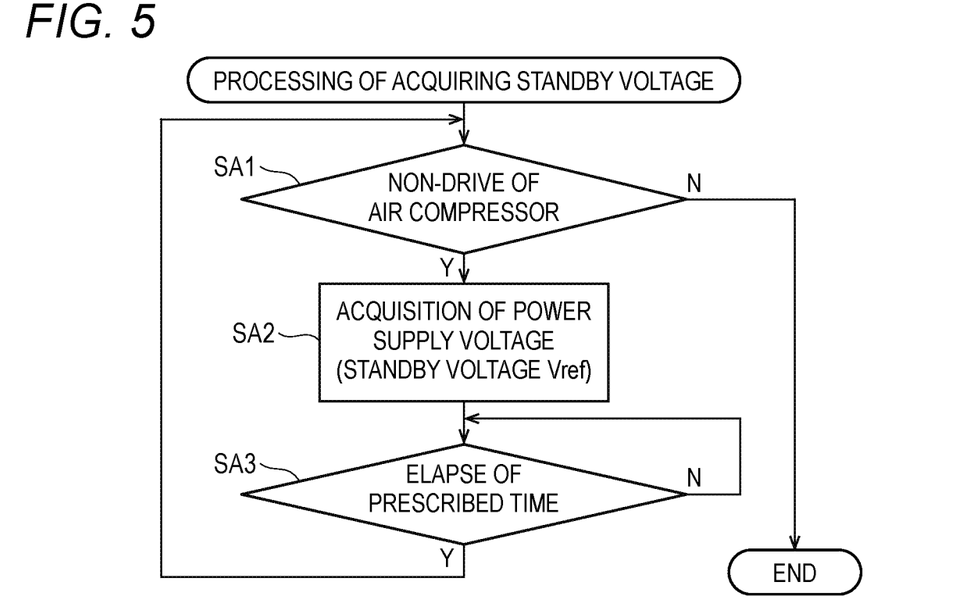
FIG. 5 is a flowchart illustrating an example of processing of acquiring a standby voltage of a power supply when the air compressor is not driven.
Figure 6:
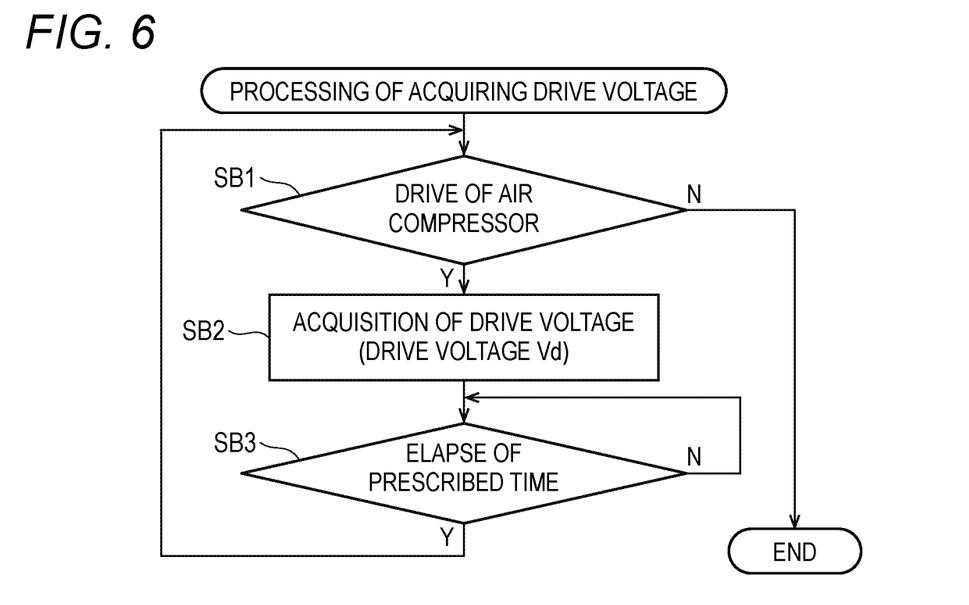
FIG. 6 is a flowchart illustrating an example of processing of acquiring a drive voltage.
Figure 7:
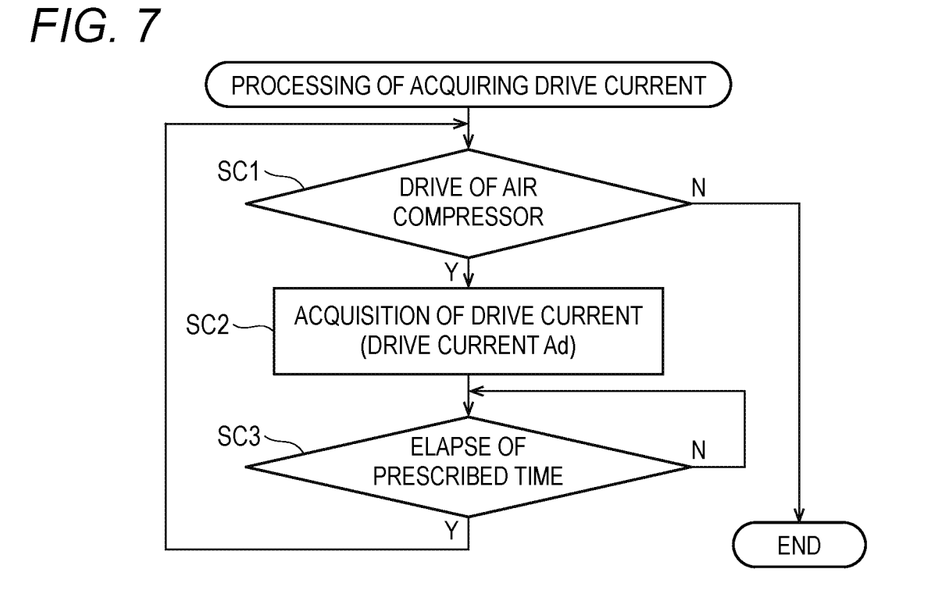
FIG. 7 is a flowchart illustrating an example of processing of acquiring a drive current.
Figure 8:
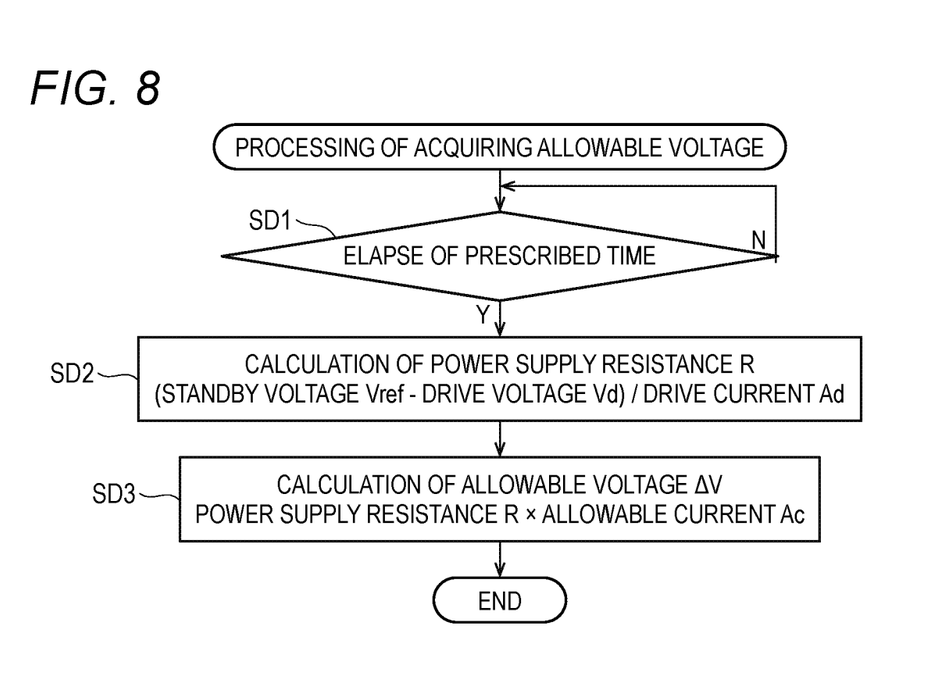
FIG. 8 is a flowchart illustrating an example of processing of acquiring an allowable voltage.

FIG. 5 is a flowchart illustrating an example of processing of acquiring a standby voltage, FIG. 6 is a flowchart illustrating an example of processing of acquiring a drive voltage, FIG. 7 is a flowchart illustrating an example of processing of acquiring a drive current, FIG. 8 is a flowchart illustrating an example of processing of acquiring an allowable voltage, and an motion example of the air compressor 1A of the present embodiment will be described with reference to the drawings.

As illustrated in FIG. 4, when the air compressor 1A is connected to the outlet 10a of the power supply 10 via the power plug 11a and the cord 11b, and the power supply is turned ON by handling the power button 60a of the handling unit 6 illustrated in FIG. 3, the control unit 7 monitors the voltage of the power supply 10 and performs processing of acquiring a standby voltage of the power supply 10. In a case where the motor 3 of the air compressor 1A is not driven and the other electrical apparatuses 12 are connected to the same power supply 10, the standby voltage is a voltage of the power supply 10 when the other electrical apparatuses 12 are not driven. Therefore, processing of acquiring the standby voltage of the power supply 10 is performed when the other electrical apparatuses 12 connected to the same power supply 10 are not driven.

Namely, in step SA1 of FIG. 5, the control unit 7 determines whether the motor 3 of the air compressor 1A is in a non-driven state. When the motor 3 is in a non-driven state, the control unit 7 acquires a voltage value of the power supply 10 as the standby voltage Vref by the voltage detection unit 70, and memorizes it in the memory unit 72 in a step SA2. Then, the control unit 7 determines whether a prescribed time, for example, 2 (s) has elapsed in step SA3, and obtains the standby voltage Vref at prescribed time intervals when the motor 3 is in a non-driven state.

When the operation mode is selected by handling of the operation mode selection button 60b of the handling unit 6 illustrated in FIG. 3, the control unit 7 controls the motor 3 in accordance with the set operation mode, stores the compressed air in the tank 4, and monitors the voltage of the power supply 10 during driving.

Namely, the control unit 7 drives the motor 3 at a prescribed output by the drive control unit 75 in accordance with the set operation mode in step SB1 of FIG. 6. and acquires the voltage value of the power supply 10 as the drive voltage Vd by the voltage detection unit 70 and memorizes it in the memory unit 72 in step SB2. The drive voltage Vd is a voltage of the power supply 10 when only the motor 3 of the air compressor 1A is driven, and when the other electrical apparatuses 12 are connected to the same power supply 10, the other electrical apparatuses 12 has power supply voltages in a non-driven state. Then, the control unit 7 determines whether a prescribed time, for example, 2 (s) has elapsed in step SB3, and obtains the drive voltage Vd at prescribed time intervals when the motor 3 is driven.

Further, the control unit 7 controls the motor 3 in accordance with the set operation mode, stores the compressed air in the tank 4, and monitors a current flowing in the air compressor 1A during driving.

Namely, the control unit 7 drives the motor 3 at a prescribed output by the drive control unit 75 in accordance with the set operation mode in step SC1 of FIG. 7, and acquires the current value as the drive current Ad of the motor 3 by the current detection unit 71 and memorizes it in the memory unit 72 in step SC2. Then, the control unit 7 determines whether a prescribed time, for example, 40 (ms) has elapsed in step SC3, and obtains the drive current Ad at prescribed time intervals.

When acquiring the standby voltage Vref, the drive voltage Vd, and the drive current Ad, the control unit 7 acquires power supply resistance when the air compressor 1A is driven. The power supply resistance is acquired, so that the allowable voltage is acquired as a threshold value at which the circuit breaker 10b is not actuated.

Namely, the control unit 7 determines if a prescribed time, for example, 10 (s) has elapsed in step SD1 of FIG. 8 after the start of driving the motor 3 at a prescribed output by the drive control unit 75 in accordance with the set operation mode, and in the power supply 10 to which the air compressor 1A is connected, a power supply resistance R that is resistance when current flows by actuating the air compressor 1A is determined from the following formula (1) and memorized in the memory unit 72 in step SD2 after the prescribed time has elapsed.

$$\text{Power supply resistance } R = (\text{standby voltage } V\text{ref} - \text{drive voltage } Vd)/\text{drive current } Ad \quad (1)$$

When the current flowing to the circuit breaker 10b exceeds a predetermined allowable current Ac, the power supply 10 actuates the circuit breaker 10b. Since the power supply resistance R of the power supply 10 to which the air compressor 1A is connected is determined from the formula (1), a voltage dropping when the allowable current Ac flows to the power supply 10 is obtained, and a voltage drop degree when the allowable current Ac flows to the power supply 10 becomes an allowable voltage at which the circuit breaker 10b is not actuated. Namely, the allowable voltage $\Delta V$ is a threshold value of the voltage at which the circuit breaker 10b is not actuated.

Therefore, in step SD3, the control unit 7 determines, from the following formula (2), the allowable voltage $\Delta V$ at which the circuit breaker 10b is not actuated based on the power supply resistance R of the power supply 10 to which the air compressor 1A is connected and based on the allowable current Ac through which the circuit breaker 10b is not actuated, and memorizes the allowable voltage $\Delta V$ in the memory unit 72.

$$\text{Allowable voltage } \Delta V = \text{power supply resistance } R \times \text{allowable current } Ac \quad (2)$$

By the above processing, the control unit 7 acquires the standby voltage Vref, the drive voltage Vd, and the drive current Ad and stores them in the memory unit 72, and updates the standby voltage Vref, the drive voltage Vd, and the drive current Ad at a prescribed timing. Averages of a plurality of values of the standby voltage Vref, the drive voltage Vd, and the drive current Ad acquired at prescribed time intervals may be calculated and used. Also, a maximum value thereof may be used. Further, the control unit 7 determines the power supply resistance R and the allowable voltage $\Delta V$ at a prescribed timing and memorizes them in the memory unit 72.

Here, since the allowable current Ac of the circuit breaker 10b is different for each power supply 10, the allowable current Ac is set in the handling unit 6 in the air compressor 1A, and is memorized in the memory unit 72. Thus, the allowable voltage $\Delta V$ can be set according to the allowable current Ac.

Figure 9:
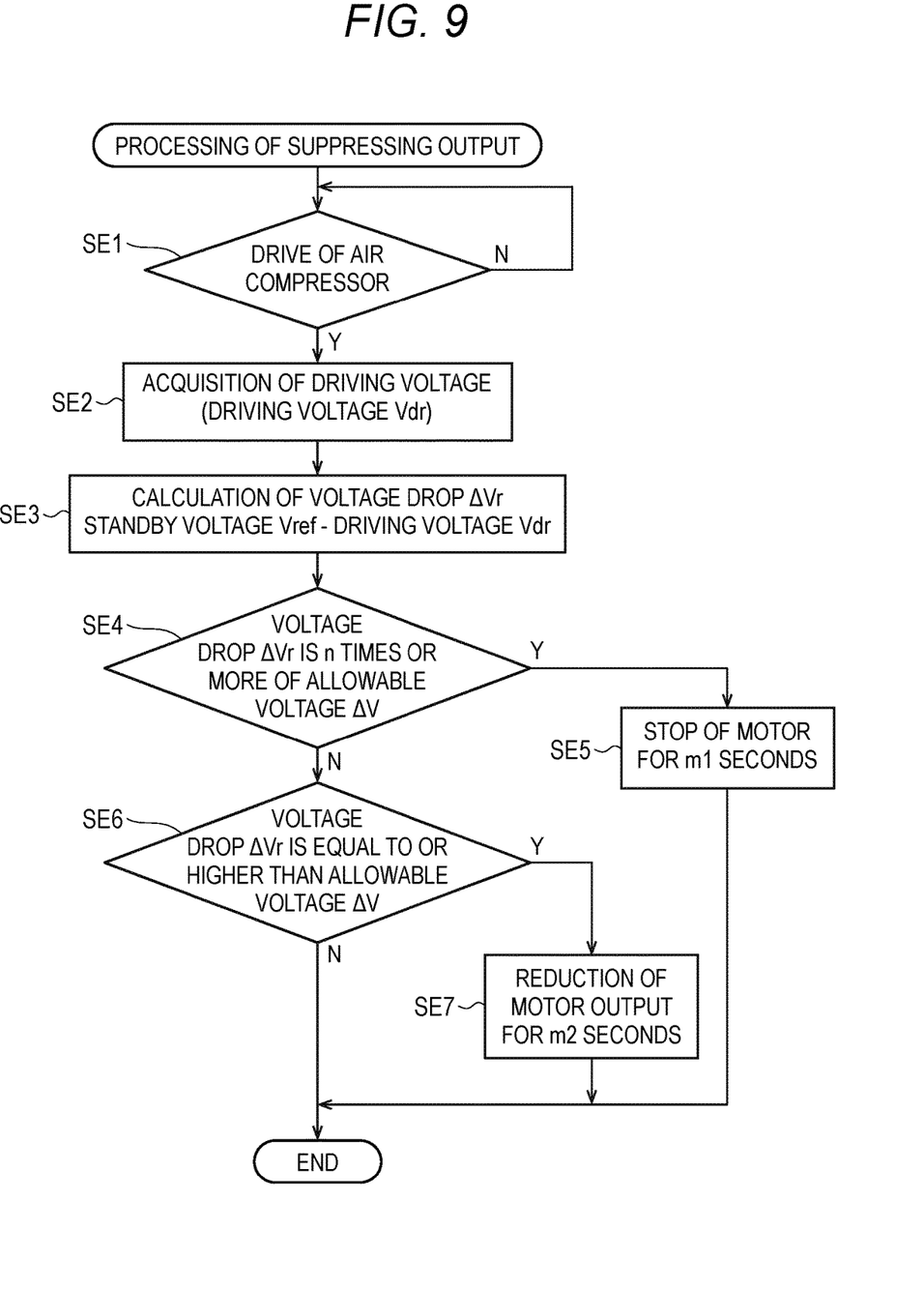
FIG. 9 is a flowchart illustrating an example of an action of controlling the air compressor in accordance with variation of a power supply voltage.

FIG. 9 is a flowchart illustrating an example of an action of controlling the air compressor in accordance with variation of a power supply voltage, and a motion of controlling the air compressor 1A and suppressing actuation of the circuit breaker 10b when the air compressor 1A and the other electrical apparatuses 12 connected to the same power supply 10 are driven will be described below.

The control unit 7 drives the motor 3 at prescribed output by the drive control unit 75 in accordance with the set operation mode in step SE1 of FIG. 9, and acquires the voltage value of the power supply 10 as the driving voltage Vdr by the voltage detection unit 70 at prescribed time intervals, for example, 120 (ms) and memorizes the voltage value in the memory unit 72 in step SE2. The driving voltage Vdr is a power supply voltage when the air compressor 1A and the other electrical apparatuses 12 are connected to the same power supply 10, and not only when the motor 3 of the air compressor 1A is driven but also when at least one electrical apparatus 12 is driven.

When the air compressor 1A is driven, the power supply voltage decreases. In a case where the other electrical apparatuses 12 are connected to the power supply 10 to which the air compressor 1A is connected, when at least one electrical apparatus 12 is driven, the power supply voltage further decreases. In step SE3, the control unit 7 calculates a voltage drop ΔVr by driving the air compressor 1A and at least one electrical apparatus 12 by the following formula (3).

$$\text{Voltage drop } \Delta Vr = \text{standby voltage } Vref - \text{driving voltage } Vdr \quad (3)$$

The control unit 7 compares the voltage drop ΔVr with the allowable voltage ΔV, determines that an overcurrent through which the circuit breaker 10b is actuated may flow when the voltage drop ΔVr is n times or more of the allowable voltage ΔV, for example, about two times (equal to or higher than first threshold value) in step SE4 as a first threshold value of the voltage drop ΔVr with respect to the allowable voltage ΔV, and stops drive of the motor 3 for m1 seconds in step SE5. The stop time m1 of the motor 3 is, for example, about several seconds.

The control unit 7 compares the voltage drop ΔVr with the allowable voltage ΔV, determines that an overcurrent through which the circuit breaker 10b is actuated may flow when the voltage drop ΔVr is equal to or higher than the allowable voltage ΔV and lower than n times of the allowable voltage ΔV in step SFE (equal to or higher than the second threshold value and lower than the first threshold value) as a second threshold value of the voltage drop ΔVr with respect to the allowable voltage ΔV. In this case, the motor 3 is still driven, but the control unit 7 reduces output of the motor 3 for m2 seconds in step SE7. The time m2 for reducing the output of the motor 3 is, for example, about several seconds. According to a possibility that the overcurrent through which the circuit breaker 10b is actuated flows, the time m1 for stopping drive of the motor 3 and the time m2 for reducing the output of the motor 3 may be different values or the same value. The threshold value of the voltage drop ΔVr with respect to the allowable voltage ΔV for driving the motor 3 again may be plural, or output may be changed stepwise. This makes it possible to use the air compressor 1A while suppressing power consumption while continuing to use other electrical apparatuses 12.

When it is determined that the overcurrent through which the circuit breaker 10b is actuated may flow by comparing the voltage drop ΔVr with the allowable voltage ΔV, notification by display on a display unit 61d of the handling unit 6 and notification by sound on the notification unit 8 are performed. Accordingly, it is possible to notify a user of the air compressor 1A and at least one user of another electrical apparatuses 12 that the circuit breaker 10b may be actuated and to facilitate suppressing use of the appratuses.

Here, after the drive of the motor 3 is stopped, the voltage drop ΔVr is acquired at prescribed time intervals, and when the voltage drop ΔVr is lower than the allowable voltage ΔV (lower than the second threshold value), the motor 3 may be driven again. When the voltage drop ΔVr is acquired at prescribed time intervals after the drive of the motor 3 is stopped. and when the voltage drop ΔVr is equal to or higher than the allowable voltage ΔV and less than n times (equal to or higher than the second threshold value and lower than the first threshold value) of the allowable voltage ΔV, the output of the motor 3 may be reduced and driven again. Further, when the voltage drop ΔVr is acquired at prescribed time intervals and the voltage drop ΔVr is lower than the allowable voltage ΔV (lower than the second threshold value) after the output of the motor 3 is lowered, the output of the motor 3 may be returned to a prescribed output according to the set motion mode.

Further, at the start of driving the motor 3, since a load is large and a large current instantaneously flows, a current flowing at the start of driving of the motor 3 is memorized as a starting current As, and the allowable voltage V is calculated based on the starting current As. When the above-described motor 3 is driven again, the control unit 7 compares the voltage drop ΔVr with the allowable voltage ΔV based on the starting current, and drives the motor 3 again when the voltage drop ΔVr becomes a value such that the overcurrent through which the circuit breaker 10b is actuated does not flow.

Further, in a case of the air compressor 1A, since the load of the motor 3 changes due to a pressure decrease in the tank 4 depending on temperature of the compression unit 2, pressure in the tank 4, and time by which the drive of the motor 3 is stopped, the allowable voltage ΔV may be calculated based on variation of the load. As a result, the overcurrent flows when driving again, and actuation of the circuit breaker 10b is suppressed.

In the present embodiment, the control unit 7 may set a plurality of threshold values which change the operation of the drive unit in accordance with the magnitude of the voltage drop with respect to a voltage drop amount when a current flows to actuate the circuit breaker to be driven, temporarily stop the drive unit when the voltage drop is equal to or higher than a first threshold value, and temporarily reduce output of the drive unit when the voltage drop is equal to or higher than a second threshold value and lower than the first threshold value.

Additionally, the control unit 7 may set a plurality of threshold values which change the operation of the drive unit in accordance with the magnitude of the power supply voltage with respect to a voltage value when the circuit breaker is driven, temporarily stop the drive unit when the power supply voltage is lower than a third threshold value, and temporarily reduce output of the drive unit when the power supply voltage is equal to or higher than the third threshold value and lower than a forth threshold value.

Action Effect of Air Compressor of the Present Embodiment

When the air compressor 1A and the other electrical apparatuses 12 connected to the power supply 10 are not driven, the power supply voltage is acquired as the standby voltage Vref by the air compressor 1A connected to the power supply 10, so that the standby voltage Vref corresponding to voltage drop is acquired when the voltage drop has occurred due to use of an extension cord, and the like.

In the air compressor 1A, the power supply voltage when the motor 3 is driven is acquired as the drive voltage Vd, and the current flowing in the air compressor 1A is acquired as the drive current Ad, so that the power supply resistance R when the motor 3 is driven can be acquired from the standby voltage Vref, the drive voltage Vd, and the drive current Ad.

The power supply resistance R is acquired based on a voltage drop degree due to drive of the motor 3, so that it is possible to estimate how much the current flows in accordance with the variation of the power supply voltage. For example, when the power supply resistance R is 1 (Ω), a current of 20 (A) flows when the voltage drop degree clue to drive of the motor 3 is 20 (V). When at least one electrical apparatus 12 connected to the same power supply 10 is driven, a current can be estimated from the voltage drop degree.

Therefore, for example, when the allowable current Ac through which the circuit breaker 10b is not actuated is 20 (A), the allowable voltage ΔV is 20 (V) when the power supply resistance R is 1 (Ω). In this example, the air compressor 1A and at least one electrical apparatus 12 is used, so that in a case where a voltage of the power supply 10 decreases, when the measured voltage drop ΔVr becomes 20 (V) or above, the air compressor 1A determines that the circuit breaker 10b may be actuated and switches control of the motor 3.

In this way, it is possible to set the allowable voltage ΔV based on the measured value by acquiring the power supply resistance R for setting the allowable voltage ΔV at which the circuit breaker 10b is not actuated based on the drive current Ad that flows by driving the motor 3. Accordingly, it is possible to set the allowable voltage ΔV by eliminating the voltage variation due to external factors such as resistance of the power supply 10 itself and resistance of wiring between the power supply 10 and the air compressor 1A, and it is possible to determine whether an overcurrent through which the circuit breaker 10b can be actuated flows based on the allowable voltage ΔV and the voltage drop ΔVr which is a drop degree of the power supply voltage.

Therefore, it is possible to eliminate false detection caused by a voltage variation due to factors of the power supply 10 itself such as instantaneous power outage and rectification disorder, and a voltage variation due to factors such as magnitude of the resistance of the wiring between the power supply 10 and the air compressor 1A, and to determine whether an overcurrent through which the circuit breaker 10b can be actuated based on the power supply voltage. As a result, when other electrical apparatuses 12 are connected to the same power supply 10 and at least one of a plurality of electrical apparatuses including the air compressor 1A are simultaneously used, the motor 3 of the air compressor 1A can be temporarily stopped or the output of the motor 3 can be temporarily reduced before the overcurrent through which the circuit breaker 10b can be actuated flows. Therefore, the motor 3 of the air compressor 1A can be controlled such that the circuit breaker 10b is not actuated in accordance with magnitude of the power consumption of the air compressor 1A as well as the power consumption of other electrical apparatuses 12. Further, it is possible to operate the motor 3 that does not lower capacity of the air compressor 1A more than necessary. Therefore, the actuation of the circuit breaker 10b can be suppressed, and the motor 3 can be operated without reducing the capacity of the air compressor 1A more than necessary.

It is also possible to determine whether the overcurrent through which the circuit breaker 10b can be actuated flows based on the power supply voltage, without acquiring a current flowing to other electrical apparatuses 12 connected to the same power supply 10.

INDUSTRIAL APPLICABILITY

The present invention is applied to an air compressor that supplies compressed air to a tool actuated by the compressed air.

The invention claimed is:
1. An electrical apparatus that is used by being connected to a power supply and that changes operation in accordance with variation of a power supply voltage of the power supply in accordance with drive of another electrical apparatus connected to the same power supply, comprising:
  a drive unit that is configured to be driven by electricity supplied from the power supply;
  a voltage detection unit that is configured to detect a power supply voltage of the power supply;
  a current detection unit that is configured to detect a current flowing by driving the drive unit; and
  a control unit that is configured to set a threshold value with which a circuit breaker which breaks the power supply is not driven, based on (i) a power supply voltage detected by the voltage detection unit when the drive unit is driven, (ii) a power supply voltage detected by the voltage detection unit when the drive unit is not driven, and (iii) a current detected by the current detection unit when the drive unit is driven.

2. The electrical apparatus according to claim 1, wherein the control unit is configured to compare a power supply voltage acquired while the drive unit is driven with the threshold value, and to change the operation of the drive unit in accordance with magnitude of the power supply voltage with respect to the threshold value.

3. The electrical apparatus according to claim 2, wherein a voltage drop is acquired based on the acquired power supply voltage acquired by the voltage detection unit while the drive unit is driven and the detected power supply voltage detected by the voltage detection unit when the drive unit is not driven, and the control unit is configured to compare the voltage drop with the threshold value, and
the control unit is configured to change the operation of the drive unit in accordance with magnitude of the voltage drop with respect to the threshold value.

4. The electrical apparatus according to claim 3, wherein the control unit is configured to set a plurality of threshold values which change the operation of the drive unit in accordance with the magnitude of the voltage drop with respect to a voltage drop amount when a current flows to actuate the circuit breaker to be driven, to temporarily stop the drive unit when the voltage drop is equal to or higher than a first threshold value, and to temporarily reduce output of the drive unit when the voltage drop is equal to or higher than a second threshold value and lower than the first threshold value.

5. The electrical apparatus according to claim 2, wherein the control unit is configured to set a plurality of threshold values which change the operation of the drive unit in accordance with the magnitude of the power supply voltage with respect to a voltage value when the circuit breaker is driven, to temporarily stop the drive unit when the power supply voltage is lower than a third threshold value, and to temporarily reduce output of the drive unit when the power supply voltage is equal to or higher than the third threshold value and lower than a forth threshold value.

6. The electrical apparatus according to claim 3, wherein the control unit is configured to compare a power supply voltage acquired by the voltage detection unit while at least one other electrical apparatus is driven, with the threshold value, and
the control unit is configured to change the operation of the drive unit in accordance with magnitude of the voltage drop with respect to the threshold value.

7. The electrical apparatus according to claim 2, wherein the control unit is configured to change the operation of the drive unit in accordance with the magnitude of the power supply voltage with respect to the threshold value and to perform notification.

8. The electrical apparatus according to claim 1, wherein the control unit is configured to set a threshold value in accordance with a load of the drive unit.

\* \* \* \* \*